United States Patent [19]

Mackie et al.

[11] Patent Number: 4,698,842

[45] Date of Patent: Oct. 6, 1987

[54] AUDIO PROCESSING SYSTEM FOR RESTORING BASS FREQUENCIES

[75] Inventors: Gregory C. Mackie; Stephen E. Satra; Chih-Ming Chen, all of Snohomish County, Wash.

[73] Assignee: Electronic Engineering and Manufacturing, Inc., Lynnwood, Wash.

[21] Appl. No.: 754,518

[22] Filed: Jul. 11, 1985

[51] Int. Cl.$^4$ .......................... H04R 5/00; G10H 1/02
[52] U.S. Cl. .......................................... 381/1; 381/98; 84/1.19; 84/DIG. 9
[58] Field of Search ................... 381/28, 56, 98, 1, 58, 381/110; 84/1.19, 1.24, DIG. 9

[56] References Cited

U.S. PATENT DOCUMENTS

| | | | |
|---|---|---|---|
| 3,213,180 | 10/1965 | Cookerly et al. | 84/1.19 |
| 3,535,969 | 10/1970 | Bonger | 84/1.19 |
| 3,651,242 | 3/1972 | Evans | 84/1.19 |
| 4,182,930 | 1/1980 | Blackmer | 381/28 |
| 4,441,203 | 4/1984 | Fleming | 381/110 |
| 4,463,650 | 8/1984 | Rupert | 84/1.19 |
| 4,542,525 | 9/1985 | Hopf | 381/56 |

Primary Examiner—Forester W. Isen
Attorney, Agent, or Firm—Seed and Berry

[57] ABSTRACT

An audio processing system for injecting left and right channel audio signals with a signal having a fundamental frequency component that is half the frequency of the highest amplitude low frequency component in the left and right channel audio signals. The left and right channel audio signals are combined to form a monaural signal that is low pass filtered and applied to a demodulator circuit. The demodulator circuit generates a control signal having a frequency that is half the frequency of the highest amplitude frequency component in the signal at the output of the band pass filter. The control signal varies the phase of the signal at the output of the band pass filter according to the polarity of the control signal. The resulting signal is selectively added to the left and right input signals. In order to prevent the audio processing circuit from producing annoying artifact when the audio signals are vocally generated, a voice detector determines that the input signals are from a vocal source and then disables the audio processing circuit. The voice detector operates by comparing the monaural (left plus right) signal to a differential signal (left minus right). Vocal source material has a relatively higher monaural signal while a musical source has a relatively higher differential signal.

11 Claims, 10 Drawing Figures

AUDIO PROCESSING SYSTEM FOR RESTORING BASS FREQUENCIES

DESCRIPTION

1. Technical Field

This invention relates to systems for improving the performance of high fidelity sound systems and, more particularly, to a system for restoring the fundamental bass frequency that has been attenuated during the recording process utilizing the second harmonic of the bass frequency.

2. Background Art

The traditional goal of high fidelity sound systems has been to produce sound that faithfully duplicates a live performance. Great advances have been made in reducing the distortion and improving the frequency response of audio components. However, true live performance quality is still not achieved, partly because of the deficiencies in the manner in which music is recorded on magnetic tape or phonograph recording media. For various reasons, the frequency components of music below about 110 Hz are generally attenuated in the recording or tape mastering process. Yet many musical instruments such as drums, pianos and basses produce frequency components that are below 110 Hz. As a result, the fundamental of such frequencies are attenuated during the mastering process, but the second and higher harmonics of that fundamental frequency component do appear on the magnetic tape or phonograph record. The presence of the harmonics of these bass instruments without the presence of the fundamental component prevents conventional audio systems from producing realistic, "live" quality sound.

One apparent technique for recovering the low frequency components that have been attenuated during mastering is to simply pass the music signal through a frequency selective amplifier or filter that boosts frequencies between about 20 Hz and 110 Hz, respectively. Boosting the low frequency signals should theoretically compensate for the attenuation of the low frequency signals during recording. However, this technique is impractical primarily because it boosts undesirable low frequency signals along with the low frequency components of the music. These undesirable low frequency components are produced by such sources as turntable rumble, turntable bounce, individuals walking across the floor of a room where the turntable is located, and low frequency audio and mechanical feedback from the speakers to the turntable. For these reasons, it is not practical to recover the low frequency fundamental components utilizing a frequency selective amplifier or filter.

In order to allow the low frequency fundamental components to be restored while avoiding the problem of boosting undesirable low frequency noise components, a signal processing circuit has been developed which is described in U.S. Pat. No. 4,182,930 to Blackmer. In the Blackmer system, left and right channel inputs are combined to produce a monaural signal which is then low pass filtered to recover the frequency components in the range of about 40-100 Hz. The resulting low pass signal is further filtered into discrete, different frequency bands such as bands at 40-50 Hz, 50-60 Hz, 60-70 Hz, 70-80 Hz, 80-90 Hz and 90-100 Hz. The output of each of these filters is presumed to be the second harmonic of the fundamental bass frequency that has been attenuated during recording. These second harmonics are then applied to respective signal generating circuits that each produce a signal having a fundamental frequency that is half the frequency of the signal from each band pass filter. The resulting fundamental components from each band are then combined with the left and right channel signals, thereby restoring the low frequency components to the left and right channel signals.

The Blackmer circuit is able to restore the fundamental bass components to certain types of musical compositions, but it is incapable of producing realistic, live quality sound for many musical compositions and it generates an annoying artifact or coloration to low frequency vocal sounds. The inability of the Blackmer system to recreate fundamental bass components of some types of music is apparently due to its property of dividing the low frequency components into several bands. This technique presumes that there are several different low frequency components in a musical composition that have been attenuated. However, such is not usually the case. To the contrary, most musical compositions contain one overriding low frequency component. By dividing the low frequency bank into several sub-bands and then generating fundamental frequencies from the frequency component in each band, the Blackmer circuit creates fundamental frequency components that do not actually exist in many musical compositions. The characteristic of the Blackmer system of creating annoying artifact in response to low frequency voice is due primarily to the differences in spectral characteristics of music and voice. Yet the Blackmer system processes musical and voice sounds in the same manner.

3. Disclosure of the Invention

It is an object of the invention to provide an audio processing circuit that restores the fundamental frequency components of musical compositions without generating annoying artifacts in low frequency vocal material.

It is another object of the invention to provide an audio processing circuit that restores the fundamental frequency components of musical compositions without adding frequency components that were not actually present in the original source material.

It is a further object of the invention to provide an audio processing circuit that restores the fundamental frequency components of musical compositions having several low frequency components by using the second harmonic of the primary low frequency component.

It is a still further object of the invention to provide an audio processing circuit that is capable of determining whether audio source material is either music or voice.

These and other objects of the invention are provided by an audio signal processing circuit that recovers a low frequency fundamental component from left and right channel signals which contain a second harmonic of the fundamental component. The fundamental component is then added to the left and right channel signals. In order to prevent annoying artifacts in voice generated audio signals, a voice detector circuit is provided to disable the audio processing system when voice signals are detected. The voice detector operates on the principal that the left and right channel voice signals are normally substantially identical to each other. In contrast, the left and right channel music signals for a music source are normally quite dissimilar from each other.

The voice detector thus applies the left and right audio signals to a mixer, thereby generating a monaural signal. The left and right channel signals are also applied to a differential circuit that generates a differential signal that is proportional to the difference between the left and right channel signals. A predetermined portion of the monaural signal is then compared to the differential signal. The comparison parameters are set so that the comparator generates an output of one polarity to disable the processing circuit when the audio signals are vocally generated, since the differential signal is then approximately zero. The comparator produces an output of the opposite polarity when the audio signals are musically generated, since the relatively large differential signal is then greater than a predetermined portion of the monaural signal. The voice detector circuit is specially designed to prevent it from recognizing random noise as a vocally generated audio signal. Random or "white" noises in the left and right channel signals are, by their random nature, quite different from each other. Consequently, the differential amplifier produces a relatively large output when random noise is present in the left and right channel signals. At the same time, the random nature of the noise makes the monaural signal relatively small. As a result, the comparator would generate an output indicative of music when voice is present over a noisy background. In order to prevent voice over a noisy background from disabling the signal processing system, the left and right channel signals are applied to a high frequency filter before the differential amplifier so that high frequency noise signals are attenuated and thus do not produce a relatively large differential signal. The processing circuit for recovering the fundamental frequency from the second harmonic of the fundamental utilizes a weighted filter that gives priority to second harmonics that are lower in frequency. Thus, in the event that the monaural signal contains the second harmonics of two different fundamental frequency components of the same amplitude, the fundamental frequency component reconstructed by the processing circuit will be that having the lower frequency.

BEST MODE FOR CARRYING OUT THE INVENTION

Figure 1:
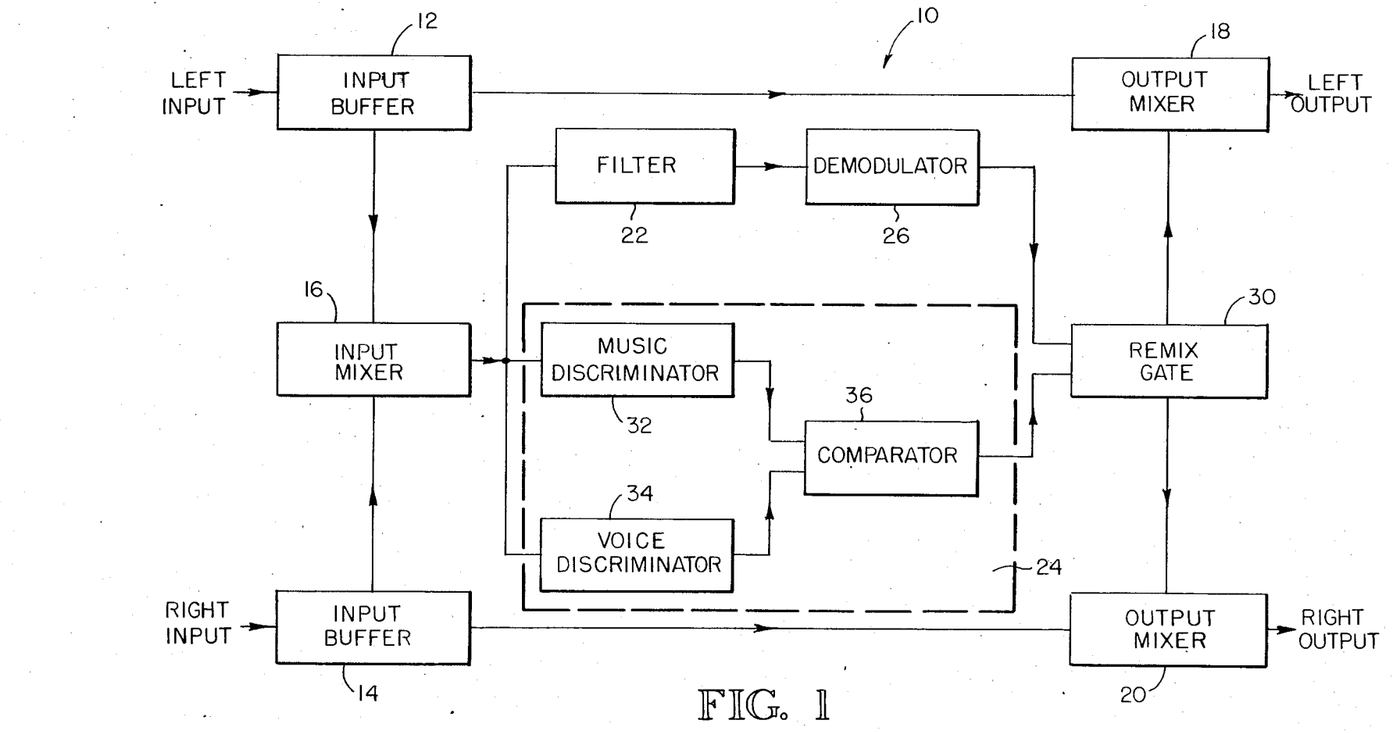
FIG. 1 is a block diagram of the audio processing system.

The inventive signal processing system, as illustrated in block diagram form in FIG. 1, receives left and right channel audio signals, processes those signals and then outputs corresponding left and right channel audio signals. The input signals are received by respective buffers 12, 14 which provide a high impedance input to the processing system 10, and apply left and right channel outputs to an input mixer 16. The input buffers 12, 14 also apply left and right channel signals to respective output mixers 18, 20.

The input mixer 16 adds the left and right channel signals together to produce a monaural signal that is applied to a low pass filter 22 and a voice detector circuit 24. The output of the filter 22 is applied to a demodulator 26. Basically, the filter 22 and demodulator 26 generate the fundamental frequency component for the primary low frequency second harmonic in the monaural signal generated at the output of the input mixer 16. More specifically, the filter 22 is a band pass filter having a band width extending from approximately 55 Hz to 120 Hz. The frequency response of the filter 22 is preferably sloped so that it attenuates the signals at the high end of the band to a greater extend than the signals at the low end of the band. This characteristic produces two desirable effects. First, the lower attenuation at the lower frequencies compensates for the reduced speaker response at lower frequencies, since the low frequency response of conventional loud speakers typically rolls off slightly below 120 Hz. Second, the greater attenuation of the signals at the higher end of the band, in combination with the operation of the demodulator 26, gives priority to the lower frequencies in the monaural signal.

As explained in greater detail below, the demodulator 26 generates an output having a frequency that is half the frequency of the primary frequency component of the signal at the output of the filter 22. Thus, if the signal at the output of the filter 22 contains two or more frequency components, the signal at the output of the demodulator 26 will have a frequency that is half that of highest amplitude frequency component at the output of the filter 22. However, as mentioned above, the reduced attenuation of the filter 22 at the low frequency end of the pass band causes the demodulator 26 to generate the fundamental of the lower frequency component of two equal amplitude frequency components applied to the filter 22.

The output of the demodulator 26 is applied to a remixing gate 30 which, when closed, applies the signal at the output of the demodulator 26 to the output mixers 18, 20. The output mixers 18, 20 add the fundamental component from demodulator 26 to the left and right channel input signals generated at the output of the respective input buffers 12, 14. The left and right output signals are thus the fundamental frequency component that was originally in the musical source added to the left and right channel input signals.

The basic concept of the signal processing circuit described above, (except for the voice detector 24 and weighted band pass filter 22) is essentially in the prior art and is substantially embodied in the commercially available unit manufactured and sold under U.S. Pat. No. 4,182,930. As mentioned above, the primary disadvantage of this commercially available unit is the annoying artifact or coloration to vocally generated source material. In order to eliminate the aforementioned problem, the monaural signal from the input mixer 16 is applied to the voice detector 24. The voice detector 24 recognizes when the monaural signal at the output of the mixer 16 is from a vocally generated source and then opens the remixer gate 30. Thus, when voice is present on the left and right channels, the output signals from the processing circuit are identical to the input signals. At all other times, the remixing gate 30 is closed thereby applying the output of the demodulator 26 to the output mixers 18, 20.

The voice detector circuit 24 includes a music discriminator 32 which generates an output that is greater for stereophonic source material than it is for monaural source material. Insofar as music is primarily stereophonic, whereas voice is primarily monaural, the output of the music discriminator 32 is greater for musically generated source material than it is for vocally generated source material. The circuit 24 also includes a voice discriminator circuit 34 that generates an output that is greater for vocally generated source material than it is for muscially generated source material. The output of the music discriminator 32 is compared to a percentage of the output of the voice discriminator 34 by a comparator 36. The output of the comparator 36 is of one polarity when the output of the music discriminator 32 is greater than the output of the voice discriminator 34 and of the opposite polarity when the output of the voice discriminator 34 has an amplitude that is greater than the amplitude of the signal at the output of the music discriminator 32.

Figure 2A:
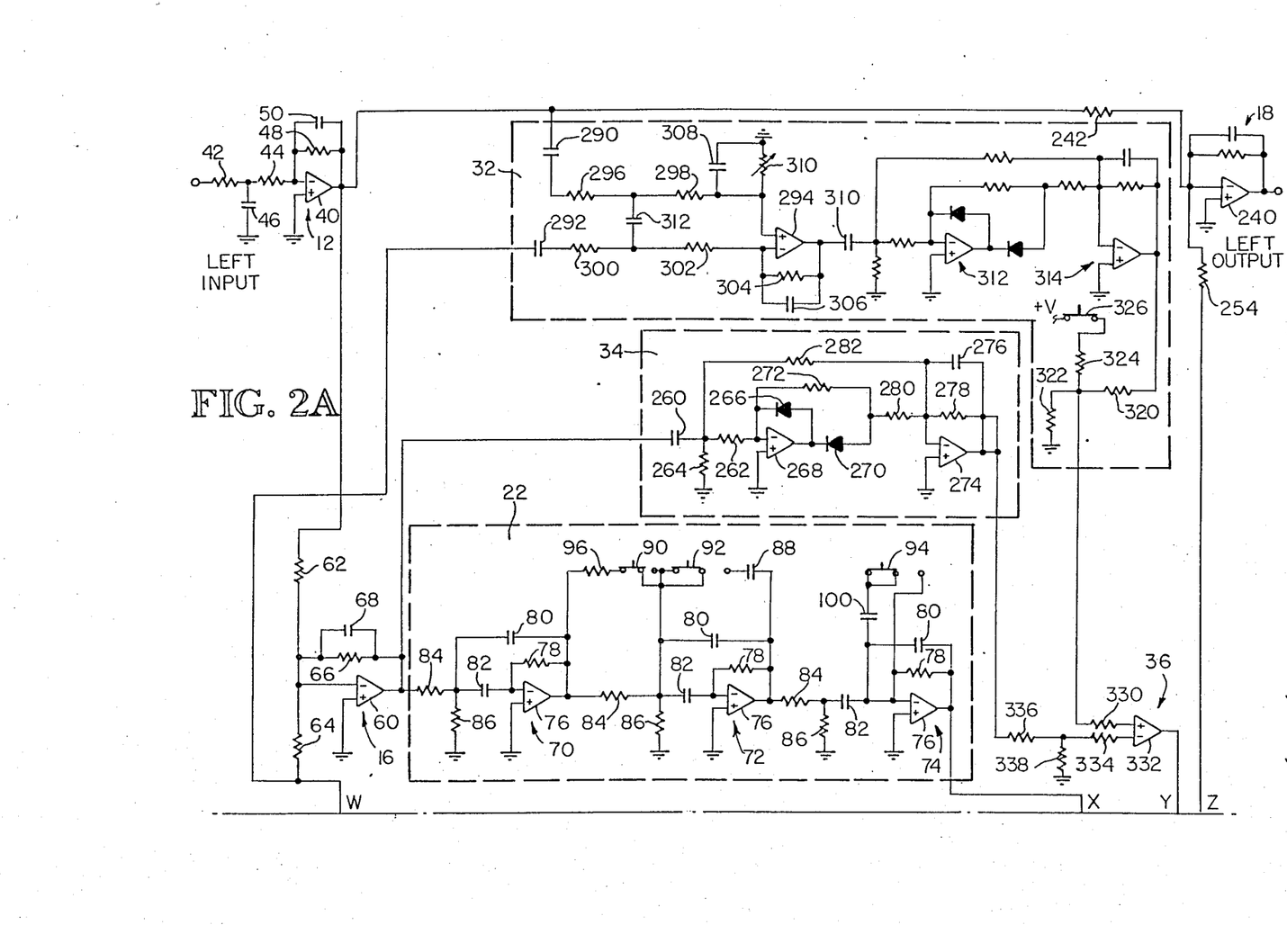
FIGS. 2a and 2b are a schematic of the audio processing system illustrated in FIG. 1.
Figure 2B:
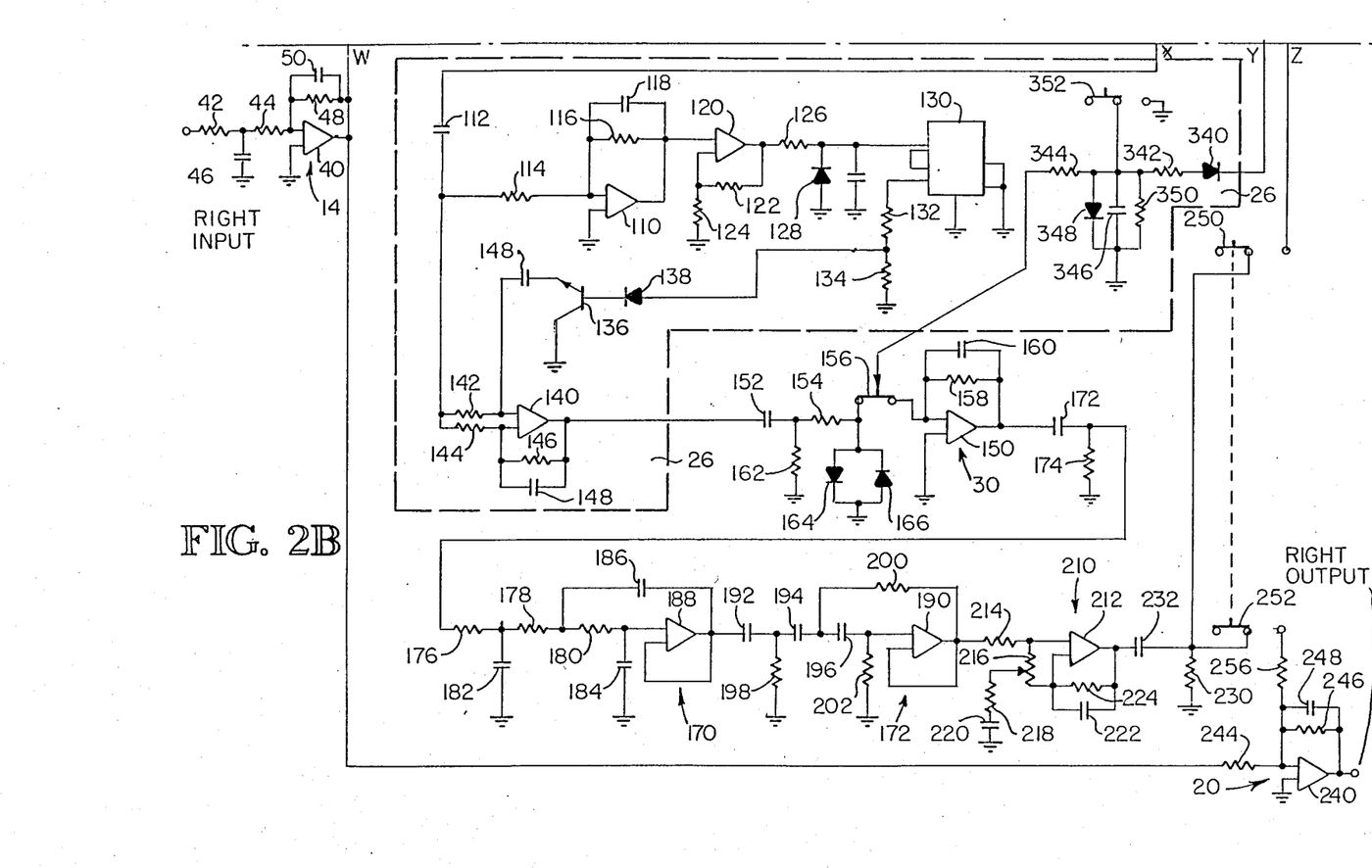

A schematic of the signal processing system is illustrated in FIG. 2. The input buffers 12, 14 each consists of a conventional operational amplifier 40 having a grounded non-inverting input and its inverting inputs forming summing junctions. The summing junctions receive respective input signals through resistors 42, 44, the high frequency components of which are attenuated above a predetermined frequency by capacitors 46. The summing junctions of the amplifiers 40 also receive respective feedback signals through feedback resistor 48 and capacitor 50. The magnitude of the feedback is substantially constant through the audio frequency range and it is then increased above a predetermined frequency. As a result of the high frequency roll off produced by the capacitors 46, 50, the input buffers 12, 14 have a frequency response that is substantially constant throughout the audio frequencies and then roll off at a predetermined frequency above the audio range.

As mentioned above, the outputs of the buffers 12, 14 are applied to a mixer 16. The mixer 16 includes a conventional operational amplifier 60 having its non-inverting input grounded and its inverting input forming a summing junction to which the outputs of the buffers 12, 14 are applied through respective resistors 62, 64. A feedback signal is applied to the summing junction 45 through feedback resistor 66 and feedback capacitor 68. The output of the mixer 16 is thus a monaural signal equal to the sum of the left and right channel signals generated at the output of the amplifiers 40.

Figure 3:
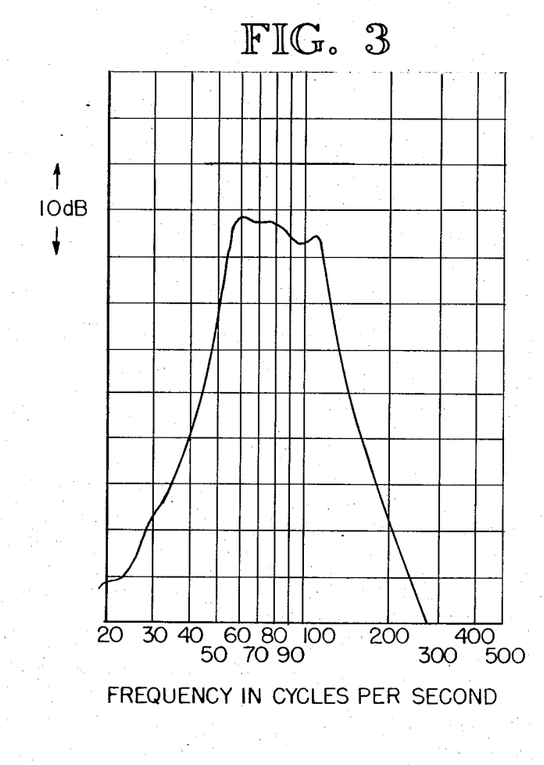
FIG. 3 is a plot of the frequency response of a band pass filter utilized in the system of FIGS. 1 and 2.

As described earlier, the output of the mixer 16 is applied to a filter 22 which, as illustrated in FIG. 2, consists of three stages 70, 72, and 74. Each of these stages 70-74 are substantially identical consisting of an operational amplifier 76 having a grounded non-inverting input, a feedback resistor 78, a feedback capacitor 80 connected to the summing junction of the amplifier 76 through input capacitor 82, and a pair of resistors 84, 86. The filters 70-76 are of conventional design and they produce a relatively high "Q" band pass. The values of the components in the three filter stages 70-74 are different from each other so that the band pass for the first stage 70 is centered at about 60 Hz, the band pass for the second stage 72 is centered at about 80 Hz, and the band pass for the third stage 74 is centered at about 110 Hz. The gain of the three stages 70-74 at their respective pass bands are also different from each other with the gain of stage 70 being the highest, the gain of stage 74 being the lowest and the gain of stage 72 being intermediate the gains of stages 70 and 74. The overall frequency response of filter 22 thus appears as illustrated in FIG. 3. Note that the pass band first peaks at about 60 Hz, a second, reduced amplitude peak then occurs at about 80 Hz and finally a third peak further reduced in amplitude appears at about 110 Hz. Note also that the skirts on either side of the band pass are fairly steep.

It is apparent from FIG. 3 that if the monaural signal at the output of the mixer 16 contains two frequency components of equal amplitude, one centered at 60 Hz and the other centered at 100 Hz, the frequency component output by the filter 22 at 60 Hz will have an amplitude that is greater than that of the frequency component centered at 100 Hz. As explained below, the fundamental frequency component generated by the demodulator 26 (FIG. 1) will thus have a frequency of 30 Hz. In this manner, the filter 22 gives priority to lower frequencies in the monaural signal at the output of the mixer 14.

The second and third filter stages 72, 74 also includes switches 90, 92, 94 for altering the frequency response of the filter 22. The switches 90, 92, 94 are mechanically interconnected so that they are always actuated with each other. When the switches 90, 92, 94 are in the position illustrated in FIG. 2, a resistor 96 is placed in parallel with resistor 84, and the filter 22 has the frequency response illustrated in FIG. 3. When the switches 90, 92, 94 are moved to their other position, resistor 96 is taken out of the circuit, and capacitor 98 is placed in parallel with capacitor 80 in stage 72 and capacitor 100 is placed in parallel with capacitor 82 in stage 74.

Figure 4:
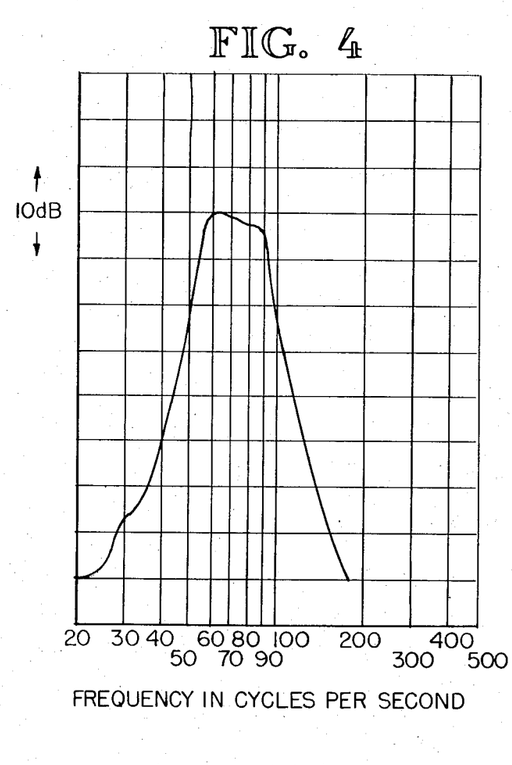
FIG. 4 is a plot of the frequency response of the band pass filter used in the audio processing system of FIGS. 1 and 2 modified to process audio signals from a videorecorder.

By effectively increasing the capacitance of capacitor 80 in stage 72 and capacitor 82 in stage 74, the band pass of the filter 22 becomes narrower and is centered at a lower frequency as illustrated in FIG. 4. By comparing FIG. 3 to FIG. 4, it is apparent that the low end frequency characteristics are the same. The difference is that the band pass now rolls off at about 90 Hz on the high end rather than about 110 Hz as illustrated in FIG. 3. The switches 90-94 and filter 22 are actuated to provide the frequency response illustrated in FIG. 4 when the sound track from a video cassette recorder is applied to the right and left inputs of the signal processing circuit 10. It has been discovered that the dialogue in movies and other video material is generally above 90 Hz. By generating an output from the demodulator 26 (FIG. 1) that is derived from second harmonics having a frequency of 90 Hz or below, the problem of annoying artifact or coloration of voice material can be eliminated while still generating the fundamental frequency from second harmonics having a frequency of below 90 Hz.

Figure 5A:
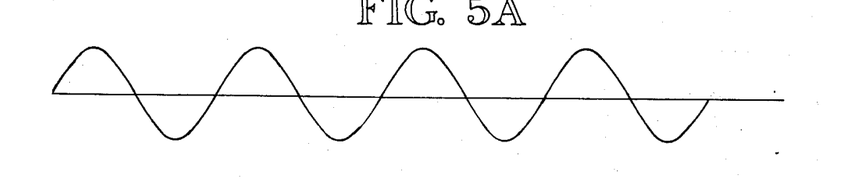
FIGS. 5a and 5b are timing diagrams showing various waveforms present in the schematic of FIG. 2.
Figure 5B:
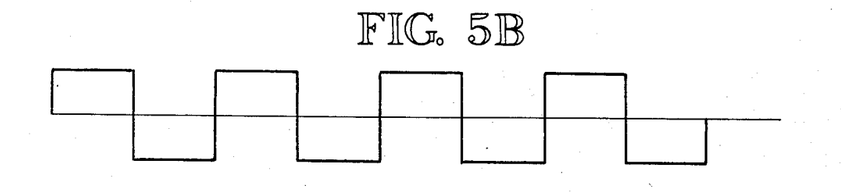

The demodulator 26 basically functions to generate a signal having a fundamental frequency component that is half the frequency of the highest amplitude the output of the filter 22. An example of a signal generated at the output of the filter is shown in FIG. 5A. With reference to FIG. 2, the output of the filter is applied to an amplifier 110 through a coupling capacitor 112 and input resistor 114. A relatively high gain is provided by the correspondingly high ratio between resistor 116 and resistor 114. The high gain of amplifier 110 causes it to generate a square wave from the sine or other waveform applied to its input. Capacitor 118, in combination with resistor 116, limits the high frequency response of the amplifier 110. The output of amplifier 110 is applied to a second operational amplifier 102 which, because of the positive feedback provided by resistor 122 and resistor 124 functions as a Schmitt trigger. The output of amplifier 120 is illustrated in FIG. 5b. This output is applied through resistor 126 to a clamping diode 128 that limits the negative voltage applied to the cathode at less than one volt.

Figure 5C:
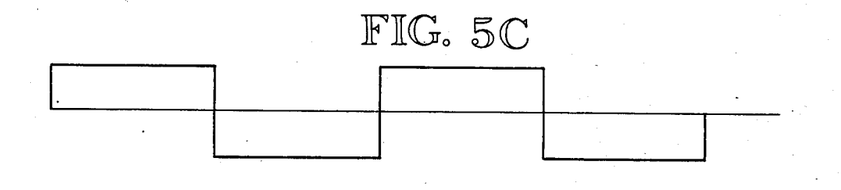
Figure 5D:
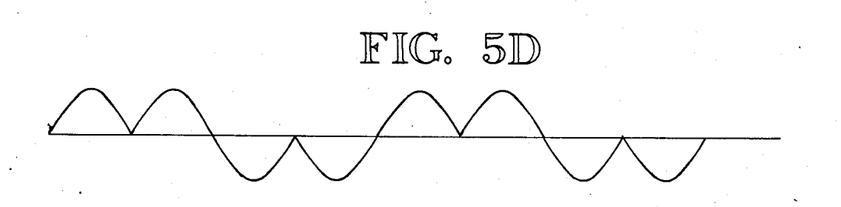

The square wave generated by amplifier 120 toggles a conventional flip flop 130 having its output applied through a pair of level shifting resistors 132, 134. The output of the flip-flop, which is illustrated in FIG. 5c, is applied through resistors 132, 134, to a switching transistor 136 through diode 138. When transistor 136 is turned on, it effectively grounds the not inverting input to amplifier 140 through coupling capacitor 142. The filtered output from the filter 22 (FIG. 5a) is applied to both the inverting and non-inverting inputs of amplifier 140 through respective resistors 142, 144. When transistor 136 is saturated, the amplifier 140 thus functions as an inverting amplifier having a gain determined by the ratio of resistor 146 to resistor 144. Capacitor 148 limits the high frequency response to the amplifier 140. When transistor 136 is driven to cut off, the amplifier 140 serves as a non-inverting amplifier. Thus, flip flop 130 alters the phase of amplifier 140 at a frequency that is half the frequency of the signal applied to the inputs of amplifier 140 through resistors 142, 144. The output of amplifier of 140 thus appears as illustrated in FIG. 5d.

The output of the amplifier 140 is applied to the remixing gate 30 (FIG. 1) which also utilizes a conventional operational amplifier 150. The signal is applied to the operational amplifier 150 through a decoupling capacitor 152, resistor 154, and FET switch 156. Feedback resistor 158 and feedback capacitor 160 set the gain and provide high frequency roll off for the amplifier 150. Resistor 162, in combination with capacitor 152, set the frequency response of the amplifier 50 at its low end. A pair of parallel connected diodes 164, 166 limit the amplitude of the signal that is applied to the amplifier 150 in order to protect the FET switch 156. As explained in greater detail below, FET switch 156 is controlled by the voice detector 24 to open the switch 156 when vocal source material is detected and close the switch 156 when musical source material is detected.

Figure 5E:
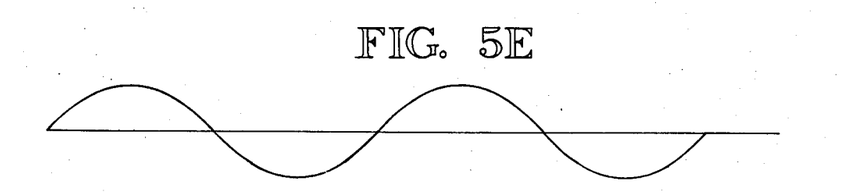

The output of amplifier 150 is filtered by two filter stages, 170 and 172. Filter stage 170 receives its input through decoupling capacitor 172 across resistor 174 and through resistors 176, 178 and 180. These resistors, in combvination with capacitors 182, 184, 186 and operational amplifier 188 form a low pass filter of conventional design having a break point of about 60 Hz. The output of amplifier 188 is applied to the input of amplifier 190 through capacitors 192, 194 and 196. These capacitors, in combination with resistors 198, 200, 202 form a high pass filter of conventional design having a low frequency break point of about 25 Hz. The filter stages 170, 172 thus form a broad band pass filter extending from about 25 Hz to about 60 Hz. The output of amplifier 190 is thus the output of amplifier 150 after it has been filtered as illustrated in FIG. 5e.

The level of the signal at the output of amplifier 190 is adjusted by a level control circuit 210 utilizing an operational amplifier 212. The amplifier 212 receives the output of amplifier 190 through resistor 214 at its non-inverting input. A potentiometer 216 is connected between the inverting and non-inverting inputs of amplifier 212. The wiper of potentiometer 216 is connected to ground through resistor 218 and capacitor 220. When the wiper of potentiometer 216 is at its upper position, the gain of amplifier 212 is relatively low, since most of the signal applied to the non-inverting input is attenuated. When the wiper of potentiometer 216 is at its lower position, the gain of amplifier 212 is relatively high, since little of the input signal is attenuated and much of the feedback signal applied through resistor 220 and capacitor 222 is attenuated. Potentiometer 216 is thus adjusted to control the level of the fundamental frequency component that is reinjected into the left and right channel outputs. The output of amplifier 212 is applied to a load resistor 230 through decoupling capacitor 232.

The output mixers 18 (FIG. 1) each consist of an operational amplifier 240 to which the outputs of left and right channel input buffers 12, 14 are applied through resistors 242, 244, respectively. The gain of the amplifiers 240 is controlled by the ratio of feedback rsistor 246 to input resistor 244. Capacitor 248 is provided to roll off the high frequency response of the amplifier 240. The output of the level control amplifier 210 is applied to both amplifiers 240 through a pair of mechanically interconnected switches 250, 252, and resistors 254, 256 when the switches 250, 252 are moved to their rightmost position. Under these circumstances, the outputs from the left and right channel output mixers 18, 20, respectively, are equal to the sum of the left and right input signals and the output from the level control circuit 210. When the switches 250, 252 are in the position illustrated in FIG. 2, the left and right channel outputs are equal to the left and right channel inputs since the fundamental frequency component is not being injected into the outputs.

As described above, the voice detector circuit 24 compares the output of a music discriminator 32 to the output of the voice discriminator 34. The voice discriminator 34, as illustrated in FIG. 2, receives the monaural signal from the mixer 16 through a coupling capacitor 260 and resistor 262. Resistor 264 limits the low frequency response of the discriminator 34. A diode 266 is connected in the feedback path of operational amplifier 268, and, the series combination of diode 270 and resistor 272 is connected in the feedback path in parallel with diode 266. Amplifier 268, in combination with operational amplifier 274, capacitor 276, and resistors 278 280 and 282, constitute a conventional full wave recitifier circuit. The output of amplifier 274 is thus a positive voltage having an amplitude proportional to the peak amplitude of the monaural signal at the output of the mixer 16.

The music discriminator circuit 32, which forms part of the voice detector 24, receives the left input signal from input buffer 12 through decoupling capacitor 290. Similarly, the right input signal from input buffer 40 is applied through decoupling capacitor 292. The left and right input signals are coupled to the differential inputs of an operational amplifier 294 through resistors 296, 298 and 300, 302, respectively. The gain of the amplifier 294 is set by the ratio of feedback resistor 304 to the input resistors 296–302. The high frequency response of the amplifier 294 is limited by feedback capacitor 306 and capacitor 308. A potentiometer 310 is used to adjust the common mode rejection of the operational amplifier 294 in order to ensure equal gains from each input.

In order to reduce the high frequency differential response of the amplifier 294, a capacitor 312 is connected between the differential inputs between resistors 296, 298 and 300, 302. The capacitor 312 attenuates the differential signal applied to the amplifier 294 thereby reducing the response of the amplifier 294 to random noise on the left and right input signals. As mentioned above, voice signals on a noisy background would otherwise cause the music discriminator 32 to produce the same output as a musically generated source, thereby "fooling" the audio processing circuit into interpreting voice as music. The output of amplifier 294 is applied through decoupling capacitor 310 to a full wave rectifier 312 and filter 314 that is identical to the full wave rectifier and filter used in the voice detector 34. The offset of the signal at the output of the filter 314 is adjusted by applying an offset voltage to voltage divider resistors 320, 322 through resistor 324 and potentiometer 326 which is connected between positive and negative voltages.

The offset adjusted differential signal at the output of the music discriminator 32 is applied to an operational amplifier 332 of comparator 36 through resistor 330. The other input to operational amplifier 332 similarly receives the monaural signal from the voice detector circuit 34 through resistor 334 after the monaural signal has been attenuated by voltage divider resistors 336, 338. It is necessary to attenuate the monaural signal from voice detector 34 since, by the very nature of summing the left and right channel's signals together, it invariably is of a higher amplitude than the differential signal, even for musically generated sources.

In operation, when the left and right channel inputs are vocally generated, the signal applied to the inverting input of the operational amplifier 332 is greater than the signal applied to its non-inverting input, thus causing amplifier 332 to generate a negative output. When the left and right input signals are from a musical source, the amplitude of the signal applied to the non-inverting input of amplifier 332 is greater than the amplitude of the signal applied to the inverting input of amplifier 332, thus causing amplifier 332 to generate a positive signal.

The negative output generated by the amplifier 332 when the voice detector circuit 24 detects a vocal source is applied to the gate of FET switch 156 through diode 340, resistor 342 and resistor 344, thereby opening FET switch 156 and disabling the signal processing system. However, capacitor 346 prevents the switch 156 from opening for a predetermined period depending upon the time constant of the capacitor 346 and resistor 342. Diode 348 protects the FET switch 156 from positive voltages. When the output of the operational amplifier 332 goes positive in response to musically generated left and right input signals, capacitor 346 discharges through resistor 350 since diode 340 blocks the positive output from operational amplifier 332. Switch 156 thus stays open for a predetermined period determined by the time constant of capacitor 346 and resistor 350. The delayed operating characteristics of the remixing gate 30 prevents the processing circuit from switching between its enabled and disabled condition at an audible frequency. A switch 352 may be actuated to ground the gate of FET switch 156 in order to maintain the processing system permanently enabled. This switch 352 thus disables the voice detector circuit 24.

It is thus seen that the audio processing circuit allows the fundamental frequency component to be injected into the left and right audio signals without producing annoying artifact when the left and right input signals are vocally generated. Moreover, the manner in which the fundamental frequency component is generated produces a pleasing and highly realistic performance.

We claim:

1. An audio processing system for recovering the low frequency fundamental component from left and right audio signals which contain a second harmonic of the fundamental component, comprising:

a first mixer receiving said left and right audio signals and generating a monaural signal at its output that is proportional to the sum of said left and right audio signals;

a band pass filter having its input connected to the output of said mixer, said band pass filter attenuating the frequency components of said monaural signal that are outside of a predetermined frequency range thereby generating a band pass filtered monaural signal;

a processing circuit connected to the output of said band pass filter, said processing circuit generating an output signal having a frequency that is half the frequency of a frequency component in said band pass filtered monaural signal;

a pair of second mixers receiving said left and right audio signals, respectively;

a switch having one of its terminals connected to said processing circuit and the other of its terminals connected to respective inputs of said second mixers, said switch applying the output signal from said processing means to said second mixers so that said second mixers generate respective output signals that are proportional to the sum of said processing circuit output signal and said left and right audio signals, said switch being selectively opened by a disable signal to remove said processing circuit output signal from said second mixer;

a differential circuit receiving said left and right audio signals and generating a differential signal at its output that is proportional to the difference between said left and said right audio signals; and a comparator receiving said monaural signal from said first mixer and said differential signal from said differential circuit, said comparator generating said disable signal when said monaural signal has an amplitude that is greater than the amplitude of said differential signal by a predetermined value selected so that said disable signal is present when said left and right audio signals are vocally generated.

2. The audio processing system of claim 1 wherein the signal generated by said processing circuit has a fundamental frequency component that is half the frequency of the highest amplitude frequency component in said band pass filtered monaural signal, and wherein said band pass filter has a frequency response that decreases in amplitude from the low end to the high end of said predetermined frequency range so that said audio processing system given priority to second harmonics having a relatively low frequency.

3. The audio processing system of claim 1 wherein the predetermined frequency range of said band pass filter is between apporoximátely 60 and 110 Hz, and wherein said audio processing system further includes a circuit for altering the operation of said band pass filter to reduce the high frequency end of said predetermined frequency range to about 90 Hz, thereby preventing said audio processing system from responding to voice signals on video tapes.

4. The audio processing system of claim 1 further including a high frequency filter operatively associated with said differential circuit to attenuate the response of said differential circuit to high frequency differences between said left and right audio signals to prevent said differential circuit from generating a relatively large differential signal responsive to random noise in said left and right audio signals.

5. An audio processing system for recovering the low frequency fundamental component from left and right audio signals which contain a second harmonic of the fundamental component, comprising:

a first mixer receiving said left and right audio signals and generating a monaural signal at its output that is proportional to the sum of said left and right audio signals;

a band pass filter having its input connected to the output of said mixer, said band pass filter attenuating the frequency components of said monaural signal that are outside a predetermined frequency range, thereby generating a band pass filtered monaural signal, said band pass filter having a frequency response that decreases in amplitude from the low end to the high end of said predetermined frequency range;

a processing circuit connected to the output of said band pass filter, said processing circuit generating a signal having a fundamental frequency component that is half the frequency of the highest amplitude frequency component in said band pass filtered monaural signal; and a pair of second mixers adding a single output signal from said processing circuit having a single frequency component to said left and right audio signals.

6. An audio processing system for recovering the low frequency fundamental component from left and right audio signals which contain a second harmonic of the fundamental component, comprising:

a first mixer receiving said left and right audio signals and generating a monaural signal at its output that is proportional to the sum of said left and right audio signals;

a band pass filter having its input connected to the output of said mixer, said band pass filter attenuating the frequency components of said monaural signal that are outside a frequency range between approximately 60 and 110 Hz, thereby generating a band pass filtered monaural signal, said band pass filter having a frequency response that decreases in amplitude from the low end to the high end of said predetermined frequency range;

a processing circuit connected to the output of said band pass filter, said processing circuit generating a signal having a fundamental frequency component that is half the frequency of the highest amplitude frequency component in said band pass filtered monaural signal;

a pair of second mixers adding the output signal from said processing circuit to said left and right audio signals; and means for altering the operation of said band pass filter to reduce the high frequency end of said predetermined frequency range to about 90 Hz, thereby preventing said audio processing system from responding to voice signals on video tapes.

7. In an audio processing system for injecting left and right channel signals with a signal having a fundamental frequency component that is half the frequency of a signal in said left and right channel signals, the improvement comprising voice detector means for disabling said audio processing circuit to prevent the signal having said fundamental frequency component from being injected into said left and right channel signals when said left and right channel signals are from a vocally generated source.

8. The audio processing system of claim 7 wherein said voice detector comprises:

differential means for generating a stereo signal having an amplitude that is proportional to the difference in amplitude between said left and right channel signals;

mixing means for generating a monaural signal having an amplitude that is proportional to the sum of said left and right channel signals; and comparator means receiving the respective outputs from said differential means and said mixing means for disabling said audio processing circuit when a predetermined percentage of said monaural signal has an amplitude that is greater than the amplitude of said stereo system.

9. The audio processing system of claim 8 further including means for reducing the high frequency response of said differential means, thereby reducing the response of said differential means to random noise on said left and right channel signals.

10. In an audio processing circuit for injecting left and right channel signals with a signal having a fundamental frequency component derived by applying said left and right channel signals to a phase reversal circuit operating at a frequency determined by the highest amplitude frequency component in said left and right channel signals, the improvement comprising a band pass filter means filtering said left and right channel signals before the signal having said fundamental frequency component is generated, said band pass filter means having a frequency response that decreases in amplitude from the low end to the high end of said predetermined frequency range so that said audio processing system gives priority to second harmonics having a relatively low frequency.

11. The audio processing system of claim 10 wherein the predetermined frequency range of said band pass filter means is between approximately 60 and 110 Hz, and wherein said audio processing system includes a circuit for altering the operation of said band pass filter means to reduce the high frequency end of said predetermined frequency range to about 90 Hz, thereby preventing said audio processing system from responding to voice signals on video tapes.

* * * * *